(12) United States Patent
Nakashiba

(10) Patent No.: US 8,508,007 B2
(45) Date of Patent: Aug. 13, 2013

(54) SOLID-STATE IMAGE SENSING DEVICE

(75) Inventor: Yasutaka Nakashiba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 198 days.

(21) Appl. No.: 11/798,222

(22) Filed: May 11, 2007

(65) Prior Publication Data
US 2007/0279504 A1  Dec. 6, 2007

(30) Foreign Application Priority Data

May 16, 2006  (JP) .................................. 2006-136093

(51) Int. Cl.
H01L 27/14 (2006.01)
H01L 27/146 (2006.01)
H04N 3/14 (2006.01)
H04N 5/335 (2006.01)
H04N 5/225 (2006.01)
G06K 9/00 (2006.01)

(52) U.S. Cl.
USPC ........... 257/431; 257/428; 257/435; 348/294; 348/340; 382/115; 382/124

(58) Field of Classification Search
USPC ............ 348/207.99, 294–324, 340, 373–376; 257/428–466, 531; 250/208.1; 382/115–116, 382/124–127, 321
See application file for complete search history.

(56) References Cited

U.S. PATENT DOCUMENTS

| | | | | |
|---|---|---|---|---|
| 5,598,016 A | * | 1/1997 | Tanabe et al. | 257/229 |
| 6,512,381 B2 | * | 1/2003 | Kramer | 324/658 |
| 6,906,403 B2 | * | 6/2005 | Bolken et al. | 257/678 |
| 7,200,288 B2 | * | 4/2007 | Ogura | 382/321 |
| 7,616,250 B2 | * | 11/2009 | Watanabe et al. | 348/340 |
| 7,728,438 B2 | | 6/2010 | Kameyama et al. | |
| 7,834,926 B2 | * | 11/2010 | Minamio et al. | 348/340 |
| 7,888,760 B2 | * | 2/2011 | Sugiyama et al. | 257/435 |
| 8,279,336 B2 | * | 10/2012 | Tsuduki et al. | 348/374 |
| 2002/0005906 A1 | * | 1/2002 | Ohkubo et al. | 348/294 |
| 2003/0124773 A1 | * | 7/2003 | Hashimoto | 438/127 |

(Continued)

FOREIGN PATENT DOCUMENTS

JP  2-26080    1/1990
JP  02026080  *  1/1990

(Continued)

OTHER PUBLICATIONS

Chinese Patent Office issued a Chinese Office Action dated Oct. 23, 2009, Application No. 200810185923.3.

(Continued)

*Primary Examiner* — Michael Osinski
(74) *Attorney, Agent, or Firm* — Young & Thompson

(57) ABSTRACT

The solid-state image sensing device is provided with an interconnect substrate, a solid-state image sensing chip and an under-filling resin. The solid-state image sensing chip is flip-chip mounted on the interconnect substrate. The solid-state image sensing chip takes a picture of an object to be imaged by photoelectrically conversion converting light incident on the back surface of the solid-state image sensing chip. An under-filling resin is used to fill the gap between the interconnect substrate and the solid-state image sensing chip. The under-filling resin serves to block light which is used to take an image by the solid-state image sensing chip.

19 Claims, 2 Drawing Sheets

(56) References Cited

U.S. PATENT DOCUMENTS

| | | | |
|---|---|---|---|
| 2003/0215117 A1 | 11/2003 | Hata | |
| 2004/0043540 A1* | 3/2004 | Kinsman | 438/125 |
| 2004/0047050 A1* | 3/2004 | Bauer et al. | 359/738 |
| 2004/0245530 A1 | 12/2004 | Kameyama et al. | |
| 2005/0219398 A1* | 10/2005 | Sato et al. | 348/340 |
| 2005/0275741 A1* | 12/2005 | Watanabe et al. | 348/340 |
| 2007/0019952 A1* | 1/2007 | Fujimori | 396/529 |
| 2007/0034995 A1 | 2/2007 | Kameyama et al. | |
| 2007/0109439 A1* | 5/2007 | Minamio et al. | 348/340 |
| 2008/0006893 A1* | 1/2008 | Nakashiba | 257/431 |
| 2008/0012084 A1* | 1/2008 | Kwon et al. | 257/432 |

FOREIGN PATENT DOCUMENTS

| | | | |
|---|---|---|---|
| JP | 2002-33467 | | 1/2002 |
| JP | 2002-033467 | * | 1/2002 |
| JP | 2002-33469 | | 1/2002 |
| JP | 2004-241752 | | 8/2004 |
| JP | 2004-296687 | | 10/2004 |
| JP | 2004-363380 | | 12/2004 |
| JP | 2005-38406 | | 2/2005 |
| JP | 2005-110896 | | 4/2005 |
| JP | 2005-327842 | | 11/2005 |

OTHER PUBLICATIONS

Japanese Office Action dated Aug. 16, 2011 in corresponding Japanese Applicaton No. 2006-136093 with English translation of the Japanese Office Action.

Japan Official Action—2006-136093—Nov. 22, 2011.

* cited by examiner

SOLID-STATE IMAGE SENSING DEVICE

This application is based on Japanese patent application NO. 2006-136093, the content of which is incorporated hereinto by reference.

BACKGROUND

1. Technical Field

The present invention relates to a solid-state image sensing device.

2. Related Art

Flip-chip packaging technology which is one of the packaging technologies for semiconductor chips is disclosed in Nikkei Electronics, Jan. 3, 2005, pp. 113-120. According to the packaging technology described in this publication, solder lands called under-bump metal are placed on bump lands of a wafer surface. Then, after solder bumps for internal connection are formed by paste printing, chips are cut out from a wafer by dicing. The chips which are cut out are connected to interconnect substrates through the above solder bumps. An under-filling resin is applied to the connector section.

Incidentally, in addition to the above publication, there are several prior art documents relating to the present invention such as Japanese Laid-open Patent publication No. 2005-38406 and Japanese Laid-open Patent publication No. 2002-33469.

Meanwhile, the above flip-chip packaging technology can be applied to a solid-state image sensing device. Namely, a solid-state image sensing chip such as a fingerprint sensor which is flip-chip mounted on an interconnect substrate can be considered.

However, the inventor of the present invention have discovered that there is the following problem in the above solid-state image sensing device. Namely, in the above solid-state image sensing device, stray light may enter the solid-state image sensing chip through the under-filling resin. If stray light enters, false signals are generated to deteriorate the image as taken.

SUMMARY

According to the present invention, there is provided a solid-state image sensing device comprising: an interconnect substrate; a solid-state image sensing chip which is flip-chip mounted on said interconnect substrate and operable to take a picture of an object to be imaged by photoelectrically converting light incident on the back surface of the solid-state image sensing chip; and an under-filling resin applied to fill a gap between the interconnect substrate and the solid-state image sensing chip and block said light.

In this solid-state image sensing device, the light blocking under-filling resin is used. By this configuration, it is possible to prevent stray light from entering the solid-state image sensing chip through the under-filling resin.

The according to the present invention, the solid-state image sensing device which can get good imaging pictorial image is realized.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In what follows, a preferred embodiment of the solid-state image sensing device according to the present invention will be explained in detail with reference to drawings. Meanwhile, when drawings are explained, like reference numbers indicate functionally similar elements and therefore redundant description will not be repeated.

First Embodiment

Figure 1:
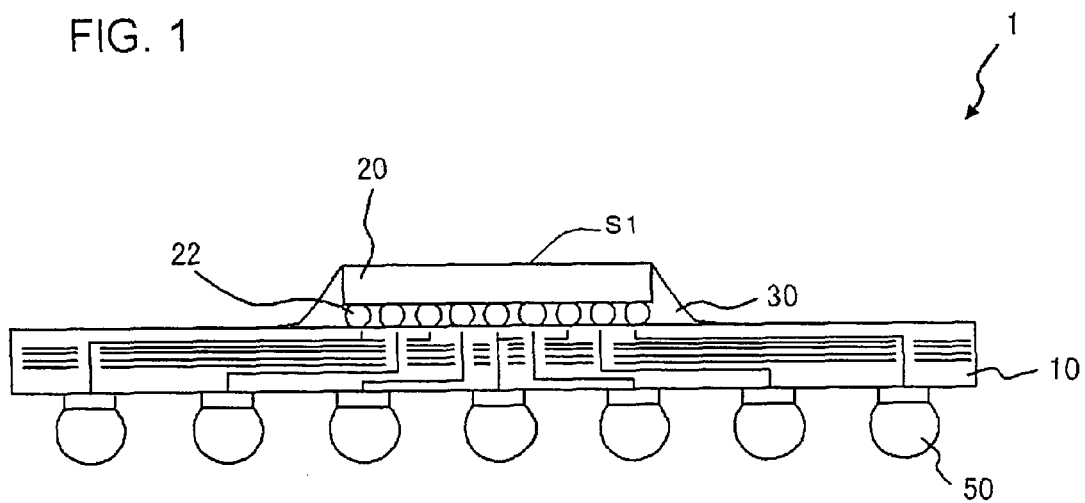
FIG. 1 is a cross sectional view for showing a solid-state image sensing device according to a first embodiment of the present invention.

FIG. 1 is a cross sectional view for showing a solid-state image sensing device according to the first embodiment of the present invention. The solid-state image sensing device 1 is provided with an interconnect substrate 10, a solid-state image sensing chip 20 and an under-filling resin 30. The interconnect substrate 10 is, for example, a printed-circuit board.

The solid-state image sensing chip 20 is flip-chip mounted on the interconnect substrate 10. In other words, the solid-state image sensing chip 20 is connected to the interconnect substrate 10 through solder bumps 22. In addition, the solid-state image sensing chip 20 has its upper surface, that is, the circuit forming surface facing the interconnect substrate 10. This solid-state image sensing chip 20 is, for example, a fingerprint sensor, and serves to take a picture of the object to be imaged by photoelectrically converting light which is incident on the back surface S1 of the solid-state image sensing chip 20.

Figure 2:
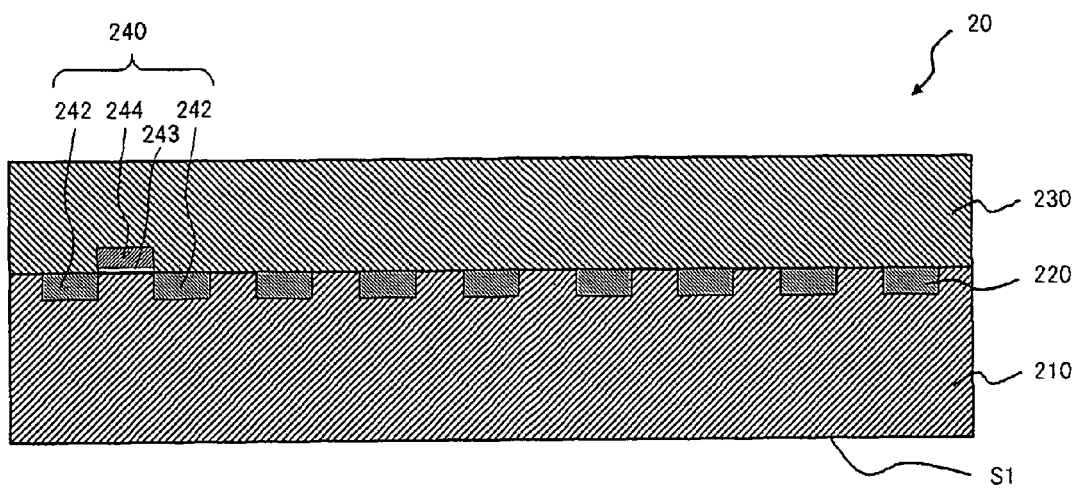
FIG. 2 is a cross sectional view for showing one example of a solid-state image sensing chip.

FIG. 2 is a cross sectional view for showing one example of the solid-state image sensing chip 20. The solid-state image sensing chip 20 as illustrated in FIG. 2 is provided with a semiconductor substrate 210 and light receiving sections 220. The semiconductor substrate 210 is, for example, a P-type silicon substrate. The back surface of the semiconductor substrate 210 (the surface opposite an interconnect layer 230 to be described below) corresponds to the above back surface S1. In the solid-state image sensing chip 20, the light passing through the object to be imaged, which is brought in contact with the back surface S1, is photoelectrically converted in the semiconductor substrate 210, and the charge generated by the photoelectric conversion is collected by the light receiving sections 220.

There are a plurality of the light receiving sections 220 formed in the semiconductor substrate 210. In particular, the light receiving sections 220 are formed in the surface layer on the upper surface side of the semiconductor substrate 210. The light receiving sections 220 are made, for example, of an N-type impurity diffused layer. The light receiving sections 220 function as photodiodes in cooperation with the adjacent semiconductor substrate 210.

A MOSFET 240 is formed also within the semiconductor substrate 210. In other words, there are a MOS image sensor section made of the light receiving sections 220 and a logic circuit section made of the MOSFET 240 and the like, which are mixedly formed within the solid-state image sensing chip 20. The MOSFET 240 includes N-type impurity diffusion layers 242 serving as source and drain regions, a gate insulating film 243 and a gate electrode 244. The interconnect layer (the layer in which interconnects are formed) 230 is formed on the upper surface of the semiconductor substrate 210.

Returning to FIG. 1, the under-filling resin 30 is used to fill the gap between the interconnect substrate 10 and the solid-state image sensing chip 20. The under-filling resin 30 is made of a light blocking material which serves to block light which is used to take an image by the solid-state image sensing chip 20. The under-filling resin 30 preferably includes particles which are opaque with respect to the above light. This under-filling resin 30 may be an epoxy resin, a silicone resin or an acrylate resin with a pigment or dyestuff mixed to the resin, for example. According to the present embodiment, the under-filling resin 30 covers not only the upper surface but also the side surface of the solid-state image sensing chip 20.

In addition, solder balls 50 are deposited on the back surface of the interconnect substrate 10 (the surface of the opposite to the solid-state image sensing chip 20) to serve as external electrode terminals.

Figure 3:
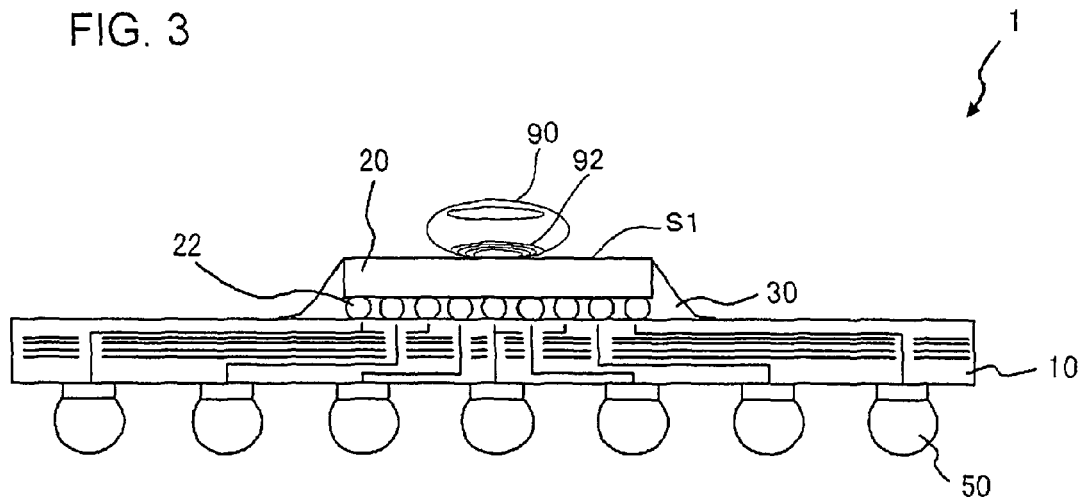
FIG. 3 is a cross sectional view for explaining an example of the operation of the solid-state image sensing device of FIG. 1.

With respect to FIG. 3, an example of the operation of the solid-state image sensing device 1 will be explained. In this case, a fingerprint sensor will be explained as an illustrative example of the solid-state image sensing chip 20. When light from a light source such as a fluorescent bulb or an LED is directed to a finger 90 which comes in contact with the back surface S1 of the solid-state image sensing chip 20 as the object to be imaged, the light transmitted through the finger 90 enters the back surface S1. At this time, the transmitted light contains information about the pattern of the fingerprint 92 of the finger 90. The above transmitted light entering the back surface S1 is photoelectrically converted inside the semiconductor substrate 210 (refer to FIG. 2). The light receiving sections 220 receive the signal charge generated by the photoelectric conversion to take an image of the fingerprint 92.

The effects of the present embodiment will be explained. The solid-state image sensing device 1 is provided with the light blocking under-filling resin 30. By this configuration, it is possible to prevent stray light from entering the solid-state image sensing chip 20 through the under-filling resin 30. Accordingly, the solid-state image sensing device 1 capable of taking higher quality images is realized.

In addition to this, the under-filling resin 30 covers the side surface of the solid-state image sensing chip 20. By this configuration, it is possible to prevent stray light from entering the solid-state image sensing chip 20 through the side surface of the solid-state image sensing chip 20. Incidentally, while the side surface of the solid-state image sensing chip 20 is generally covered by the under-filling resin 30 in the example of the present embodiment, the under-filling resin 30 may be applied to cover only part of the side surface of the solid-state image sensing chip 20. Also in such a case, as compared with the case where the side surface of the solid-state image sensing chip 20 is entirely exposed, the adverse effect of stray light can be suppressed. However, it is not indispensable condition that the under-filling resin 30 partly or entirely covers the side surface of the solid-state image sensing chip 20. The under-filling resin 30 has effect as long as it covers at least the upper surface of the solid-state image sensing chip 20.

Incidentally, in the case where the interconnect substrate 10 is too thin, the stray light passing through the interconnect substrate 10 becomes problematic. In this regard, if the light blocking under-filling resin 30 is provided to cover at least the upper surface of the solid-state image sensing chip 20 as in the present embodiment, it is possible to block the stray light passing through the interconnect substrate 10.

Meanwhile, Japanese Patent Published Application No. 2005-38406 discloses a fingerprint image sensing device having a front-illuminated type solid-state image sensing chip mounted on an interconnect substrate. If the solid-state image sensing chip is of a front-illuminated type, the object to be imaged has to be in contact with the upper surface (on the interconnect layer side) of the solid-state image sensing chip, and thereby there are concerns that damage, characteristic deterioration, electrostatic breakdown and the like may occur in the solid-state image sensing chip. Particularly, when the object to be imaged is a finger, excessive static electricity would be applied from the finger to devices (light receiving element, transistor and so forth). Because of this, the fingerprint image sensing device of the publication is provided with a protective member on the solid-state image sensing chip for the purpose of preventing damage to the solid-state image sensing chip. However, this measure results in a greater complexity of the device configuration and an increase in the number of manufacturing steps.

Contrary to this, the solid-state image sensing chip 20 is of a back-illuminated type. Because of this, the object to be imaged need not be in contact with the upper surface of the solid-state image sensing chip 20. Thereby, according to the present embodiment, it is possible to suppress the damage, characteristic deterioration, electrostatic breakdown and the like of the solid-state image sensing chip 20 without resulting in a greater complexity of the device configuration and an increase in the number of manufacturing steps.

Second Embodiment

Figure 4:
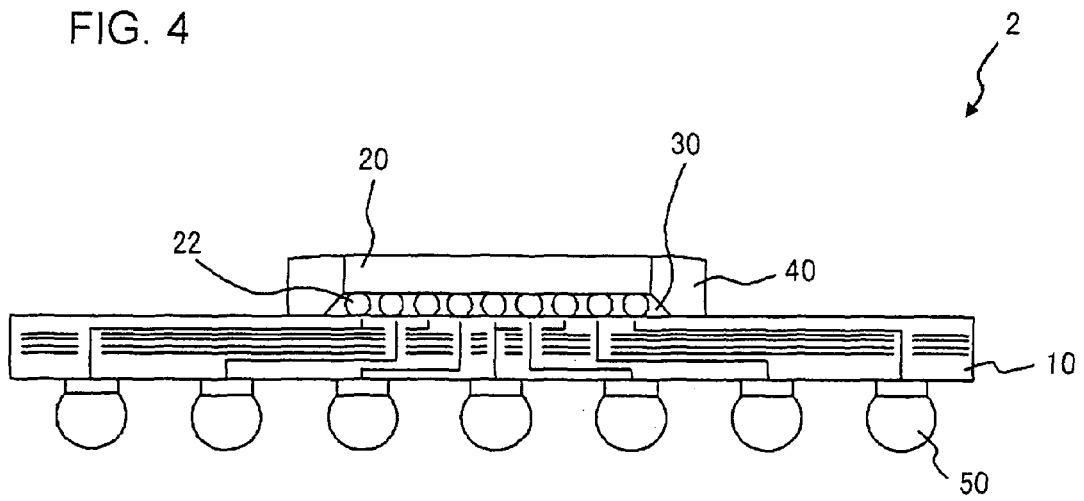
FIG. 4 is a cross sectional view for showing a solid-state image sensing device according to a second embodiment of the present invention.

FIG. 4 is a cross sectional view for showing a solid-state image sensing device according to the second embodiment of the present invention. The solid-state image sensing device 2 is provided with an interconnect substrate 10, a solid-state image sensing chip 20, an under-filling resin 30 and a side-filling resin 40. The configurations of the interconnect substrate 10 and the solid-state image sensing chip 20 are the same as described in conjunction with FIG. 1. Also in the present embodiment, the solid-state image sensing chip 20 is flip-chip mounted on the interconnect substrate 10.

According to the present embodiment, the side-filling resin 40 is provided to cover the side surface of the solid-state image sensing chip 20. The side-filling resin 40 serves to block light which is used to take an image by the solid-state image sensing chip 20 in the same manner as the under-filling resin 30. Namely, the side-filling resin 40 is also made of a light blocking material.

The effects of the present embodiment will be explained. The solid-state image sensing device 2 is provided with the light blocking side-filling resin 40. By this configuration, it is possible to prevent stray light from entering the solid-state image sensing chip 20 through the side-filling resin 40. Accordingly, in the case of the solid-state image sensing device 2, while the under-filling resin 30 prevents stray light from entering the solid-state image sensing chip 20 through the upper surface of the solid-state image sensing chip 20, the side-filling resin 40 prevents stray light from entering the solid-state image sensing chip 20 through the side surface of the solid-state image sensing chip 20. Because of this, it is possible to more effectively suppress the adverse effect of the stray light. Meanwhile, the other advantages of the solid-state image sensing device 2 are the same as those of the solid-state image sensing device 1.

The solid-state image sensing device according to the present invention is not limited to the above embodiments, but the various modifications can be effected. For example, while the solid-state image sensing chip is implemented with an N-channel MOSFET (MOSFET 240) as shown in FIG. 2, a P-channel MOSFET may be formed in addition to this. Also, while the N-type light receiving sections are formed within the P-type silicon substrate in the examples, a P-type light receiving sections may be formed within an N-type silicon substrate. Furthermore, the present invention may be applied to a CCD (Charge Coupled Device) type solid-state image sensing device.

It is apparent that the present invention is not limited to the above embodiment, and may be modified and changed without departing from the scope and spirit of the invention.

What is claimed is:

1. A solid-state image sensing device, comprising:
an interconnect substrate having an entirety of an upper surface that is continuous and substantially flat;
a solid-state image sensing chip having an entire back surface that is substantially flat and a front surface that is on the side opposite to said back surface, said solid-state image sensing chip being flip-chip mounted on said upper surface of said interconnect substrate and operable to take a picture of an object to be imaged by photoelectrically converting light incident on the back surface of said solid-state image sensing chip with the back surface directly contacting the object;
a gap defining a volume provided uniformly between i) said front surface of said solid-state image sensing chip and ii) a whole region of said interconnect substrate facing and located beneath said front surface of said solid-state image sensing chip;
a light-blocking, under-filling resin filling an entirety of said gap and volume provided between said front surface of the solid-state image sensing chip and said interconnect substrate facing and located beneath said front surface of said solid-state image sensing chip, said under-filling resin filling said volume blocking light from entering said gap and said front face of the solid-state image sensing chip; and
a light-blocking, side-filling resin covering side surfaces of said solid-state image sensing chip and side surfaces of said under-filling resin and blocking said light from entering the side surfaces of said solid-state image sensing chip, and
wherein said side-filling resin is formed so as not to overlap with said solid-state image sensing chip in plan-view.

2. The solid-state image sensing device as set forth in claim 1, wherein said side-filling resin extends from an upper edge of the side surfaces of solid-state image sensing chip to the upper surface of said interconnect substrate, contacts and completely surrounds said under-filling resin.

3. A solid-state image sensing device, comprising:
an interconnect substrate having a first surface;
a solid-state image sensing chip having a second surface, a third surface that is on the side opposite to the second surface, and a fourth surface located between the second surface and the third surface, the solid-state image sensing chip being mounted on the interconnect substrate so that the second surface faces the first surface and is operable to photoelectrically convert a light incidents on the third surface;
a plurality of bumps formed between the first surface and the second surface;
a first resin filling in between the first surface and the second surface and blocking a first light from a front surface of the chip; and
a second resin being in contact with the fourth surface and blocking a second light from a side surface of the chip, wherein the first resin has an extended portion extended to outside of the second surface and the second resin is in contact with the extended portion.

4. The solid-state image sensing device as set forth in claim 3, wherein the second resin is in contact with the interconnect substrate.

5. The solid-state image sensing device as set forth in claim 3, wherein the second resin does not overlap with the second surface in plan-view.

6. The solid-state image sensing device as set forth in claim 3, wherein the first resin is located on the first surface and not located on the second surface.

7. The solid-state image sensing device as set forth in claim 3, wherein the third surface directly contacts an object to be imaged.

8. The solid-state image sensing device as set forth in claim 3, wherein an entirety of the third surface is flat.

9. The solid-state Image sensing device as set forth in claim 3, wherein an entirety of the first surface is flat.

10. The solid-state image sensing device as set forth in claim 3, wherein the first resin is in contact with a part of the fourth surface.

11. The solid-state image sensing device as set forth in claim 3, wherein an object to be imaged is a finger, and the solid-state image sensing chip is used to take an image of the fingerprint of the finger.

12. The solid-state image sensing device as set forth in claim 3, wherein the first resin is surrounded by the second resin.

13. The solid-state image sensing device as set forth in claim 3, wherein the solid-state image sensing chip includes a charge coupled device.

14. The solid-state image sensing device as set forth in claim 3, wherein the interconnect substrate includes a printed circuit board.

15. The solid-state image sensing device as set forth in claim 3, wherein the first resin includes opaque particles.

16. The solid-state image sensing device as set forth in claim 3, wherein the first resin includes one of an epoxy resin, a silicon resin, and acrylate resin.

17. The solid-state image sensing device as set forth in claim 3, wherein light that incidents on the third surface is provided by one of an LED and a fluorescent bulb.

18. The solid-state image sensing device as set forth in claim 3, wherein the solid-state image sensing chip is of a back-illuminating type.

19. The solid-state image sensing device as set forth in claim 3, wherein the third surface opposingly faces a corresponding portion of the first surface.

* * * * *